(12) United States Patent
Lee et al.

(10) Patent No.: US 8,599,149 B2
(45) Date of Patent: Dec. 3, 2013

(54) ORGANIC LIGHT EMITTING DIODE DISPLAY

(75) Inventors: Jaedo Lee, Gumi-si (KR); Howon Choi, Daegu (KR); Sangwoo Seo, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 528 days.

(21) Appl. No.: 12/588,771

(22) Filed: Oct. 27, 2009

(65) Prior Publication Data

US 2010/0309150 A1 Dec. 9, 2010

(30) Foreign Application Priority Data

Jun. 8, 2009 (KR) .................. 10-2009-0050572

(51) Int. Cl.
*G06F 3/041* (2006.01)
*G09G 3/30* (2006.01)

(52) U.S. Cl.
USPC ............................... 345/173; 345/76

(58) Field of Classification Search
USPC ........................................ 345/173
See application file for complete search history.

(56) References Cited

U.S. PATENT DOCUMENTS

| | | | |
|---|---|---|---|
| 6,424,094 B1 | 7/2002 | Feldman | |
| 6,885,157 B1 | 4/2005 | Cok et al. | |
| 7,876,037 B2 * | 1/2011 | Koshihara et al. | 313/504 |
| 2001/0046604 A1 | 11/2001 | Geaghan | |
| 2002/0047969 A1 * | 4/2002 | Minakuchi | 349/117 |
| 2002/0167270 A1 * | 11/2002 | Siwinski et al. | 313/506 |
| 2002/0186209 A1 * | 12/2002 | Cok | 345/173 |
| 2002/0191287 A1 * | 12/2002 | Miyazawa et al. | 359/486 |
| 2003/0222857 A1 * | 12/2003 | Abileah | 345/173 |
| 2004/0212300 A1 * | 10/2004 | Chao et al. | 313/506 |
| 2004/0262605 A1 * | 12/2004 | Park et al. | 257/59 |
| 2005/0099402 A1 * | 5/2005 | Nakanishi et al. | 345/173 |
| 2006/0209045 A1 * | 9/2006 | Su et al. | 345/173 |
| 2007/0242055 A1 | 10/2007 | Lai | |
| 2008/0211394 A1 * | 9/2008 | Koshihara et al. | 313/504 |
| 2009/0046077 A1 * | 2/2009 | Tanaka et al. | 345/174 |
| 2009/0122021 A1 * | 5/2009 | Liu et al. | 345/173 |

FOREIGN PATENT DOCUMENTS

| | | |
|---|---|---|
| CN | 1614624 | 5/2005 |
| CN | 101257746 | 9/2008 |
| EP | 1953626 | 8/2008 |
| JP | 5-224813 A | 9/1993 |
| JP | 9-203890 A | 8/1997 |
| JP | 11-167097 A | 6/1999 |
| JP | 2001-154178 A | 6/2001 |
| JP | 2003-99193 A | 4/2003 |

(Continued)

*Primary Examiner* — Alexander S Beck
*Assistant Examiner* — Mihir Rayan
(74) *Attorney, Agent, or Firm* — McKenna Long & Aldridge, LLP

(57) ABSTRACT

An organic light emitting diode (OLED) display is disclosed. The OLED display includes a plurality of subpixels on one surface of a first substrate, a second substrate attached to the first substrate, a shield electrode on one surface of the second substrate that is not opposite to the subpixels, the shield electrode being connected to a low potential voltage source, a touch screen panel on the shield electrode, a first printed circuit board (PCB) attached to the one surface of the first substrate, the first PCB receiving a driving signal driving the subpixels from a driving device, and a second PCB attached to the one surface of the second substrate, the second PCB transmitting a sensing signal generated by the touch screen panel to an external device.

11 Claims, 8 Drawing Sheets

(56) References Cited

FOREIGN PATENT DOCUMENTS

| | | |
|---|---|---|
| JP | 2005-38231 A | 2/2005 |
| JP | 2005-44247 A | 2/2005 |
| JP | 2006-195316 A | 7/2006 |
| KR | 2001-0051880 | 6/2001 |
| KR | 10-2008-0089910 | 10/2008 |
| TW | 200739400 | 10/2007 |
| WO | WO 2007/066590 A1 | 6/2007 |
| WO | WO 2007/102238 A1 | 9/2007 |

\* cited by examiner

ORGANIC LIGHT EMITTING DIODE DISPLAY

This application claims the benefit of Korea Patent Application No. 10-2009-0050572 filed on Jun. 8, 2009, the entire contents of which is incorporated herein by reference for all purposes as if fully set forth herein.

BACKGROUND OF THE INVENTION

1. Field of the Invention

This document relates to an organic light emitting diode (OLED) display.

2. Description of the Related Art

An organic light emitting element used in an organic light emitting diode (OLED) display has a self-emission structure in which a light emitting layer is formed between two electrodes on a substrate. The OLED display may be classified into a top emission type OLED display, a bottom emission type OLED display, and a dual emission type OLED display depending on an emitting direction of light. The OLED display may be classified into a passive matrix type OLED display and an active matrix type OLED display depending on a driving manner.

In the OLED display, each subpixel includes a transistor unit including a switching transistor, a driving transistor, and a capacitor and an organic light emitting diode including a lower electrode connected to the driving transistor, an organic light emitting layer, and an upper electrode.

In the OLED display, when a scan signal, a data signal, a power, etc. are supplied to a plurality of subpixels arranged in a matrix format, selected subpixels emit light to thereby display an image. The above-described OLED display may be manufactured as a thin profile OLED display. Recently, many studies are being carried out to add a touch screen function to a thin profile display device such as the OLED display.

SUMMARY OF THE INVENTION

In one aspect, there is an organic light emitting diode (OLED) display comprising a plurality of subpixels on one surface of a first substrate, a second substrate attached to the first substrate, a shield electrode on one surface of the second substrate that is not opposite to the subpixels, the shield electrode being connected to a low potential voltage source, a touch screen panel on the shield electrode, a first printed circuit board (PCB) attached to the one surface of the first substrate, the first PCB receiving a driving signal driving the subpixels from a driving device, and a second PCB attached to the one surface of the second substrate, the second PCB transmitting a sensing signal generated by the touch screen panel to an external device.

In another aspect, there is an organic light emitting diode (OLED) display comprising a plurality of subpixels on one surface of a first substrate, a second substrate attached to the first substrate, a shield electrode on other surface of the first substrate on which the subpixels are not formed, the shield electrode being connected to a low potential voltage source, a touch screen panel on the shield electrode, a first printed circuit board (PCB) attached to the one surface of the first substrate, the first PCB receiving a driving signal driving the subpixels from a driving device, and a second PCB attached to the other surface of the first substrate, the second PCB transmitting a sensing signal generated by the touch screen panel to an external device.

In another aspect, there is an OLED display comprising a plurality of subpixels on one surface of a first substrate, a second substrate attached to the first substrate, a shield electrode on one surface of the second substrate opposite the subpixels, the shield electrode being connected to a low potential voltage source, a touch screen panel on other surface of the second substrate that is not opposite to the subpixels, a first printed circuit board (PCB) attached to the one surface of the first substrate, the first PCB receiving a driving signal driving the subpixels from a driving device, and a second PCB attached to other surface of the first substrate, the second PCB transmitting a sensing signal generated by the touch screen panel to an external device.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail embodiments of the invention examples of which are illustrated in the accompanying drawings.

Figure 1:
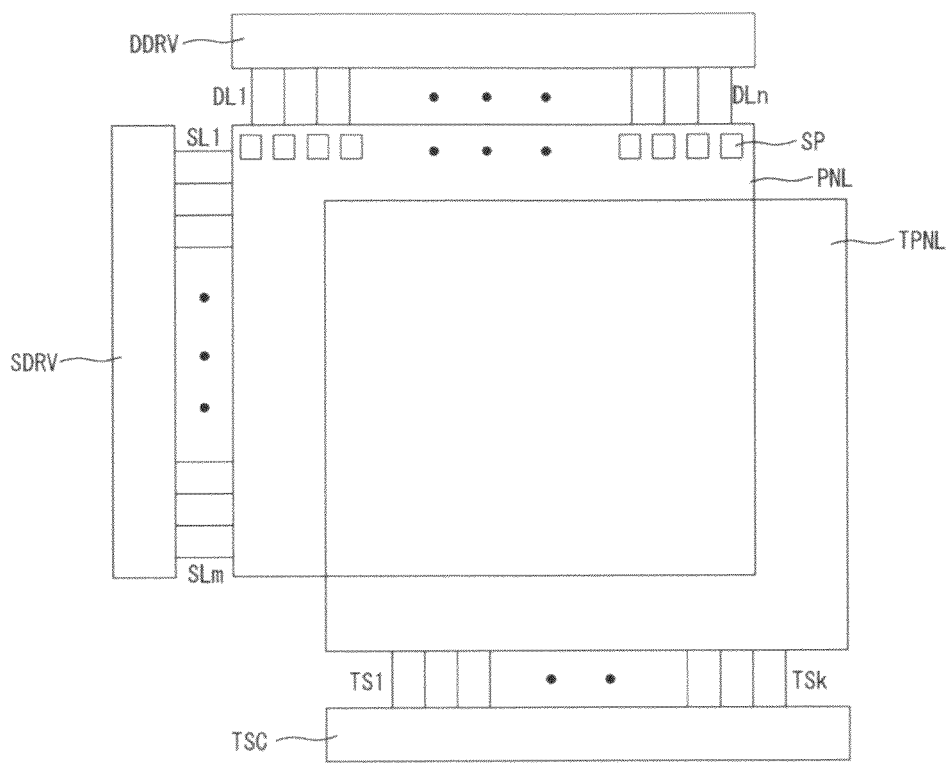
FIG. 1 is a block diagram of a display device according to an embodiment of the invention.

As shown in FIG. 1, a display device according to an embodiment of the invention includes a panel PNL, a touch screen panel TPNL, a scan driver SDRV, a data driver DDRV, and a sensing unit TSC.

The panel PNL is an organic light emitting diode (OLED) display panel including a plurality of subpixels SP. However, the panel PNL may be a panel of a flat panel display, such as a liquid crystal display (LCD), a plasma display panel (PDP), and a field emission display (FED). Each of the subpixels SP includes a switching transistor driven by a scan signal, a capacitor storing a data signal as a data voltage, a driving transistor driven by the data voltage stored in the capacitor, and an organic light emitting diode emitting light by a drive of the driving transistor. When the scan signal from the scan driver SDRV and the data signal from the data driver DDRV are supplied to the subpixels SP, the subpixels SP emit light, and thus the panel PNL may display an image. The scan driver SDRV is connected to the subpixels SP through scan lines SL1, SL2 . . . SLm to supply the scan signal to the subpixels SP. The data driver DDRV is connected to the subpixels SP through data lines DL1, DL2 . . . DLn to supply the data signal to the subpixels SP. The touch screen panel TPNL includes an electrode unit, so that position information about a touch position according to a user's touch operation is produced as a sensing signal. The sensing unit TSC is connected to the electrode unit of the touch screen panel TPNL to sense the position information through the electrode unit when the user touches the touch screen panel TPNL. The sensing unit TSC may be classified into a capacitive sensing unit using changes in capacitance (i.e., changes in capacitance according to a dielectric constant) and a resistive sensing unit using changes in resistance depending on a structure of the electrode unit of the touch screen panel TPNL. In the embodiment of the invention, for example, the OLED display having the capacitive type touch screen panel TPNL is described.

A structure of the subpixels SP is described in detail below with reference to FIG. 2.

Figure 2:
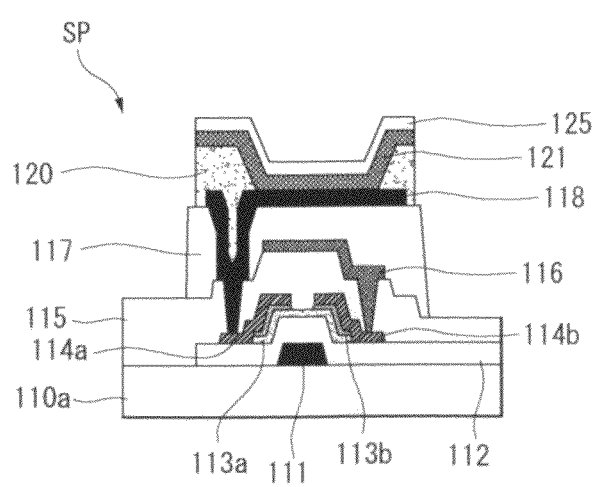
FIG. 2 is a cross-sectional view of a subpixel.

As shown in FIG. 2, a gate electrode 111 is positioned on one surface of a first substrate 100a. The gate electrode 111 may be formed of molybdenum (Mo), aluminum (Al), chromium (Cr), gold (Au), titanium (Ti), nickel (Ni), neodymium (Nd) and copper (Cu), or a combination thereof. The gate electrode 111 may have a single-layered structure or a multi-layered structure. For example, the gate electrode 111 may have a double-layered structure including Mo/Al—Nd or Mo/Al. Other materials and structures may be used.

A first insulating layer 112 is positioned on the gate electrode 111. The first insulating layer 112 may be formed of silicon oxide ($SiO_x$), silicon nitride ($SiN_x$), or a combination thereof. The first insulating layer 112 may have a single-layered structure or a multi-layered structure. Other materials and structures may be used. An active layer 113a is positioned on the first insulating layer 112. The active layer 113a may be formed of amorphous silicon or crystallized polycrystalline silicon. Other materials may be used. The active layer 113a may include a channel region, a source region, and a drain region. An ohmic contact layer 113b may be positioned on the active layer 113a.

A source electrode 114a and a drain electrode 114b are positioned on the ohmic contact layer 113b and are respectively connected to the source region and the drain region of the active layer 113a. The source electrode 114a and the drain electrode 114b may have a single-layered structure or a multi-layered structure. When the source electrode 114a and the drain electrode 114b each have the single-layered structure, the source electrode 114a and the drain electrode 114b may be formed of Mo, Al, Cr, Au, Ti, Ni, Nd, Cu, or a combination thereof. When the source electrode 114a and the drain electrode 114b each have the multi-layered structure, the source electrode 114a and the drain electrode 114b may have a double-layered structure including Mo/Al—Nd or a triple-layered structure including Mo/Al/Mo or Mo/Al—Nd/Mo.

A second insulating layer 115 is positioned on the source electrode 114a and the drain electrode 114b. The second insulating layer 115 may be formed of silicon oxide ($SiO_x$), silicon nitride ($SiN_x$), or a combination thereof. The second insulating layer 115 may have a single-layered structure or a multi-layered structure. Other materials and structures may be used. A shield metal 116 may be positioned on the second insulating layer 115. The shield metal 116 may be connected to the source electrode 114a and the drain electrode 114b and may protect the transistor from external interference. A third insulating layer 117 is positioned on the second insulating layer 115. The third insulating layer 117 may be formed of silicon oxide ($SiO_x$), silicon nitride ($SiN_x$), or a combination thereof. The third insulating layer 117 may have a single-layered structure or a multi-layered structure. Other materials and structures may be used.

A lower electrode 118 is positioned on the third insulating layer 117 and is connected to the source electrode 114a or the drain electrode 114b. The lower electrode 118 may be an anode electrode or a cathode electrode. In case the lower electrode 118 is the cathode electrode, the lower electrode 118 may be formed of aluminum (Al), Al alloy, and aluminum neodymium (AlNd). In addition, the lower electrode 118 being the cathode electrode may be formed of a material having a high reflectance. Other materials may be used. A bank layer 120 is positioned on the lower electrode 118. The bank layer 120 has an opening exposing a potion of the lower electrode 118. The bank layer 120 may be formed of an organic material, such as benzocyclobutene (BCB)-based resin, acrylic resin, or polyimide resin. Other materials may be used.

Figure 3:
FIG. 3 is a cross-sectional view of an organic light emitting layer.

An organic light emitting layer 121 is positioned on the lower electrode 118. The organic light emitting layer 121, as shown in FIG. 3, may include an electron injection layer 121a, an electron transport layer 121b, a light emitting layer 121c, a hole transport layer 121d, and a hole injection layer 121e. The electron injection layer 121a functions to facilitate the injection of electrons. The electron injection layer 121a may be formed of Alq3(tris(8-hydroxyquinolino)aluminum), PBD, TAZ, spiro-PBD, BAlq or SAlq. Other materials may be used. The electron transport layer 121b may function to smoothly transport electrons. The electron transport layer 121b may be formed of at least one selected from the group consisting of Alq3(tris(8-hydroxyquinolino)aluminum, PBD, TAZ, spiro-PBD, BAlq, and SAlq. Other materials may be used. The light emitting layer 121c may be formed of a material capable of producing red, green, and blue light, for example, a phosphorescence material or a fluorescence material. In case the light emitting layer 121c emits red light, the light emitting layer 121c includes a host material including carbazole biphenyl (CBP) or N,N-dicarbazolyl-3,5-benzene (mCP). Further, the light emitting layer 121c may be formed of a phosphorescence material including a dopant material including any one selected from the group consisting of PIQIr (acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum) or a fluorescence material including PBD:Eu(DBM)3(Phen) or Perylene. Other materials may be used. In case the light emitting layer 121c emits green light, the light emitting layer 121c includes a host material including CBP or mCP. Further, the light emitting layer 121c may be formed of a phosphorescence material including a dopant material including Ir(ppy)3(fac tris(2-phenylpyridine)iridium) or a fluorescence material including Alq3(tris(8-hydroxyquinolino)aluminum). Other materials may be used. In case the light emitting layer 121c emits blue light, the light emitting layer 121c includes a host material including CBP or mCP. Further, the light emitting layer 121c may be formed of a phosphorescence material including a dopant material including (4,6-F2 ppy)2Irpic or a fluorescence material including any one selected from the group consisting of spiro-DPVBi, spiro-6P, distyryl-benzene (DSB), distyryl-arylene (DSA), PFO-based polymer, PPV-based polymer and a combination thereof. Other materials may be used. The hole transport layer 121d may function to smoothly transport holes. The hole transport layer 121d may be formed of at least one selected from the group consisting of NPD(N,N-dinaphthyl-N,N'-diphenyl benzidine), TPD(N,N'-bis-(3-methylphenyl)-N,N'-bis-(phenyl)-benzidine, s-TAD and MTDATA(4,4', 4"-Tris(N-3-methylphenyl-N-phenyl-amino)-triphenylamine). Other materials may be used. The hole injection layer 121e may function to facilitate the injection of holes.

The hole injection layer 121e may be formed of at least one selected from the group consisting of copper phthalocyanine (CuPc), PEDOT(poly(3,4)-ethylenedioxythiophene), polyaniline (PANI) and NPD(N,N-dinaphthyl-N,N'-diphenyl benzidine). Other materials may be used. At least one of the electron injection layer 121a, the electron transport layer 121b, the hole transport layer 121d, and the hole injection layer 121e may be omitted.

An upper electrode 125 is positioned on the organic light emitting layer 121. The upper electrode 125 may be an anode electrode or a cathode electrode. In case the upper electrode 125 is the anode electrode, the upper electrode 125 may be formed of a transparent material, such as indium tin oxide (ITO), indium zinc oxide (IZO), indium tin zinc oxide (ITZO), and $Al_2O_3$ doped ZnO (AZO). Other materials may be used. The subpixels SP having the above-described structure emit light in a front or rear direction according to the structure of the lower electrode 118 and the upper electrode 125.

Figure 4:
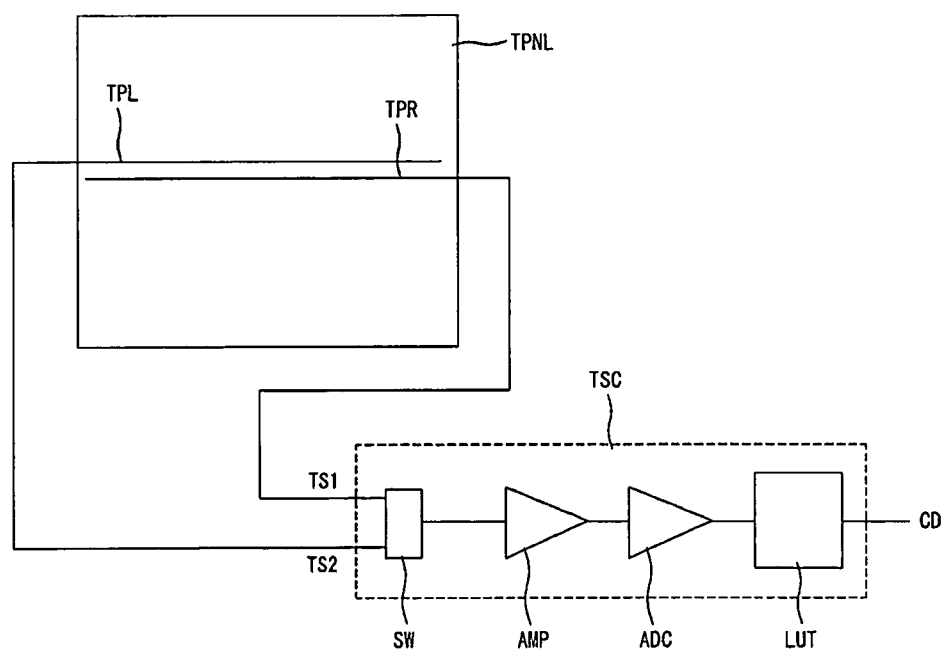
FIGS. 4 to 6 schematically illustrate a configuration of a capacitive sensing unit and a structure of a single-layered electrode unit.
Figure 5:
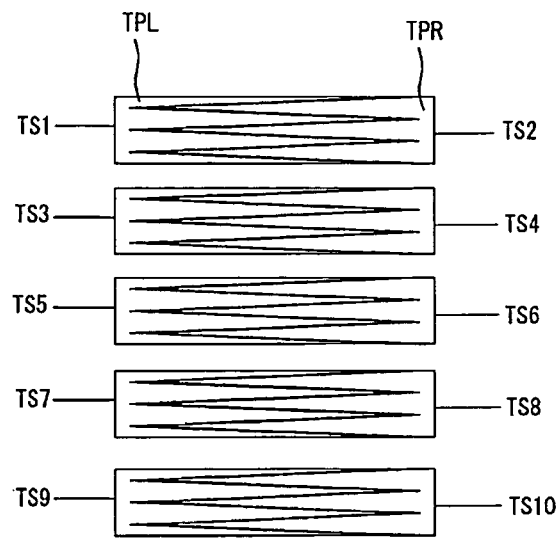
Figure 6:
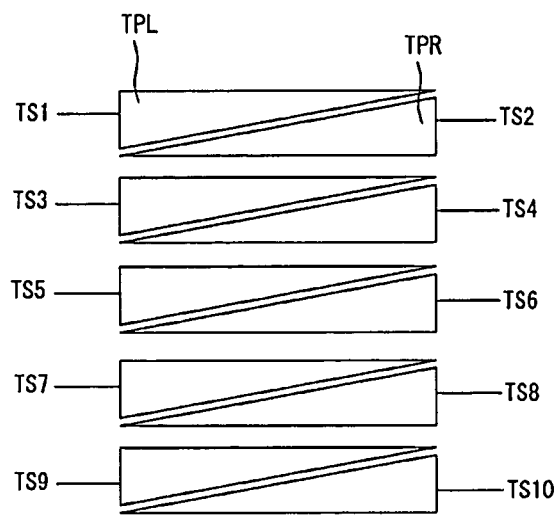

FIGS. 4 to 6 schematically illustrate a configuration of the capacitive sensing unit TSC and a structure of a single-layered electrode unit of the touch screen panel TPNL.

As shown in FIG. 4, the capacitive sensing unit TSC is connected to electrode units TPL and TPR positioned inside the touch screen panel TPNL. The capacitive sensing unit TSC recognizes changes in a capacitance of the electrode units TPL and TPR when the user touches the touch screen panel TPNL to sense a touch position according to the user's touch operation. For this, the capacitive sensing unit TSC may include a signal input unit SW, a signal amplifying unit AMP, a signal converting unit ADC, and a signal detecting unit LUT. Other configurations may be used. The signal input unit SW receives a signal through lines TS1 and TS2 connected to the electrode units TPL and TPR. The signal amplifying unit AMP amplifies the signal received from the signal input unit SW. The signal converting unit ADC converts an analog signal into a digital signal. The signal detecting unit LUT recognizes changes in the capacitance of the electrode units TPL and TPR using the digital signal to detect position data about the user's touch position. Then, the signal detecting unit LUT transmits the detected position data to a device CD to be used.

As shown in FIGS. 5 and 6, the electrode units TPL and TPR are connected to the capacitive sensing unit TSC through lines TS1, TS2 . . . TS10. The electrode units TPL and TPR may include first electrodes TPL, each of which is arranged from left to right of the touch screen panel TPNL and second electrodes TPR, each of which is arranged from right to left of the touch screen panel TPNL. The first electrodes TPL and the second electrodes TPR may be positioned on the same layer to be spaced apart from each other at a constant distance. Further, the first electrodes TPL and the second electrodes TPR may have different areas, so that the first electrodes TPL and the second electrodes TPR have different capacitances. The embodiment of the invention is not limited to the electrode units TPL and TPR shown in FIGS. 4 to 6.

Figure 7:
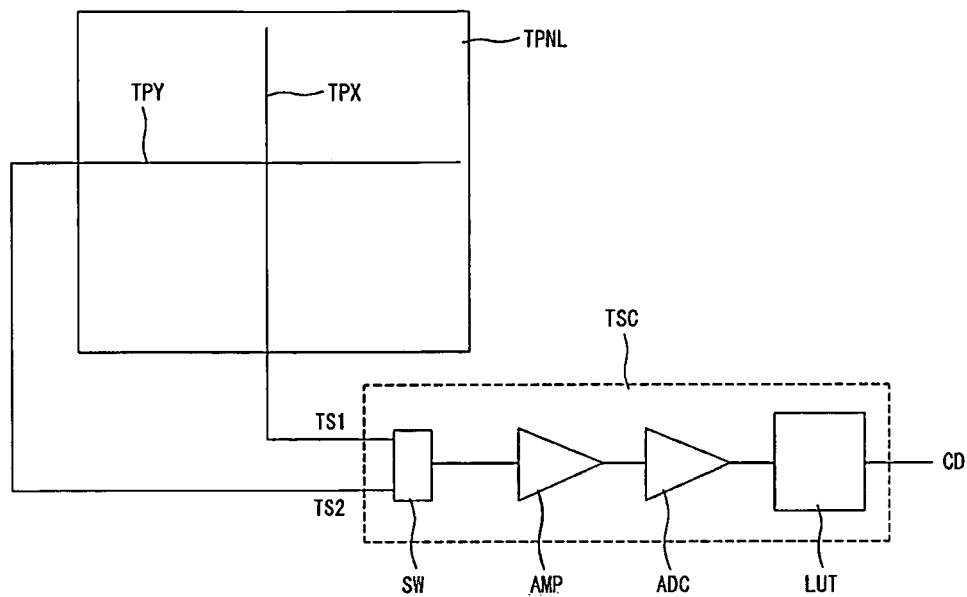
FIGS. 7 to 9 schematically illustrate a configuration of a capacitive sensing unit and a structure of a multi-layered electrode unit.
Figure 8:
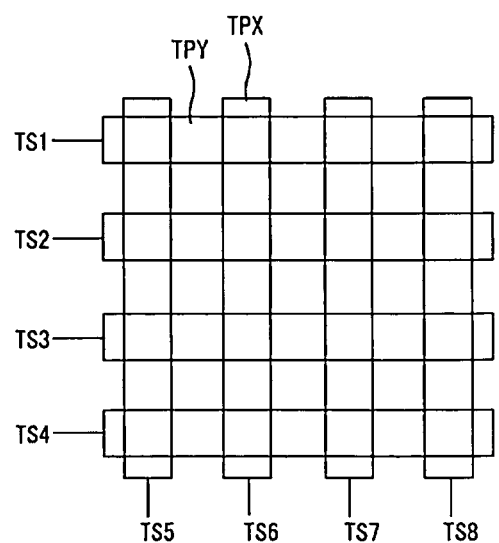
Figure 9:
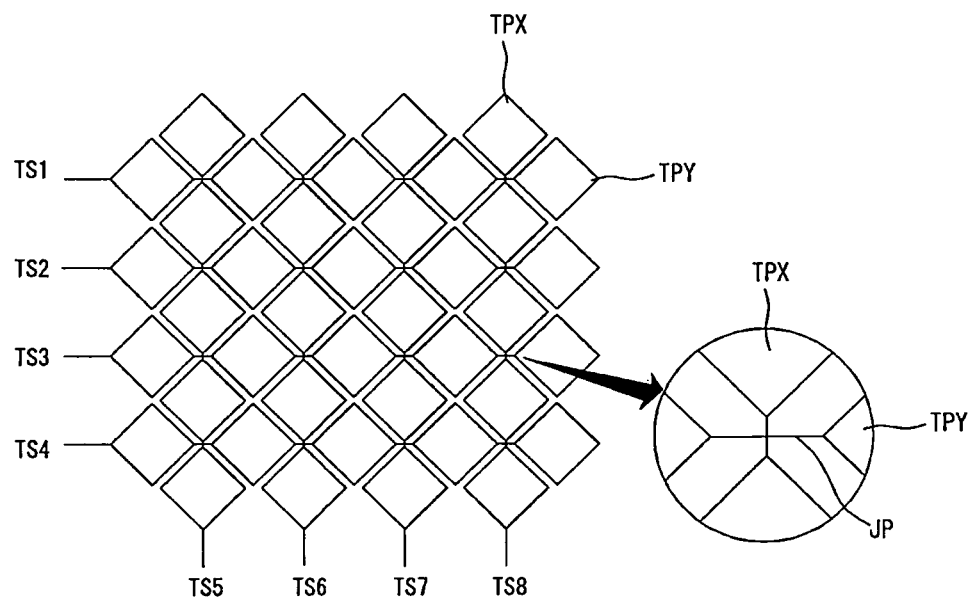

FIGS. 7 to 9 schematically illustrate a configuration of the capacitive sensing unit TSC and a structure of a multi-layered electrode unit.

As shown in FIG. 7, the capacitive sensing unit TSC is connected to electrode units TPY and TPX positioned inside the touch screen panel TPNL. The capacitive sensing unit TSC recognizes changes in a capacitance of the electrode units TPY and TPX when the user touches the touch screen panel TPNL to sense a touch position according to the user's touch operation. For this, the capacitive sensing unit TSC may include a signal input unit SW, a signal amplifying unit AMP, a signal converting unit ADC, and a signal detecting unit LUT. Other configurations may be used. The signal input unit SW receives a signal through lines TS1 and TS2 connected to the electrode units TPY and TPX. The signal amplifying unit AMP amplifies the signal received from the signal input unit SW. The signal converting unit ADC converts an analog signal into a digital signal. The signal detecting unit LUT recognizes changes in the capacitance of the electrode units TPY and TPX using the digital signal to detect position data about the user's touch position. Then, the signal detecting unit LUT transmits the detected position data to a device CD to be used.

As shown in FIGS. 8 and 9, the electrode units TPY and TPX are connected to the capacitive sensing unit TSC through lines TS1, TS2 . . . TS8. The electrode units TPY and TPX may include first electrodes TPY arranged in a Y-axis direction of the touch screen panel TPNL and second electrodes TPX arranged in an X-axis direction of the touch screen panel TPNL. The first electrodes TPY and the second electrodes TPX may be positioned opposite each other with an insulating layer interposed between the first electrodes TPY and the second electrodes TPX. Namely, the first electrodes TPY and the second electrodes TPX may be positioned on different layer. As shown in FIG. 9, in case the electrode units TPY and TPX have a diamond shape, a jumper electrode JP may be used to electrically connect electrodes on the same layer to one another. In other words, the jumper electrode JP helps to electrically connect the electrodes on the same layer to one another through a different layer. The embodiment of the invention is not limited to the electrode units TPY and TPX shown in FIGS. 7 to 9.

Figure 10:
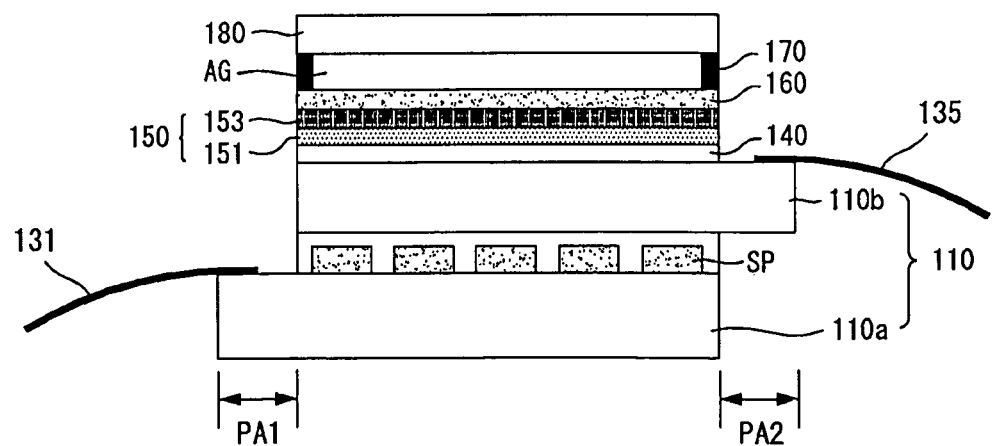
FIGS. 10 to 12 schematically illustrate a structure of an organic light emitting diode (OLED) display having a capacitive touch screen panel.
Figure 11:
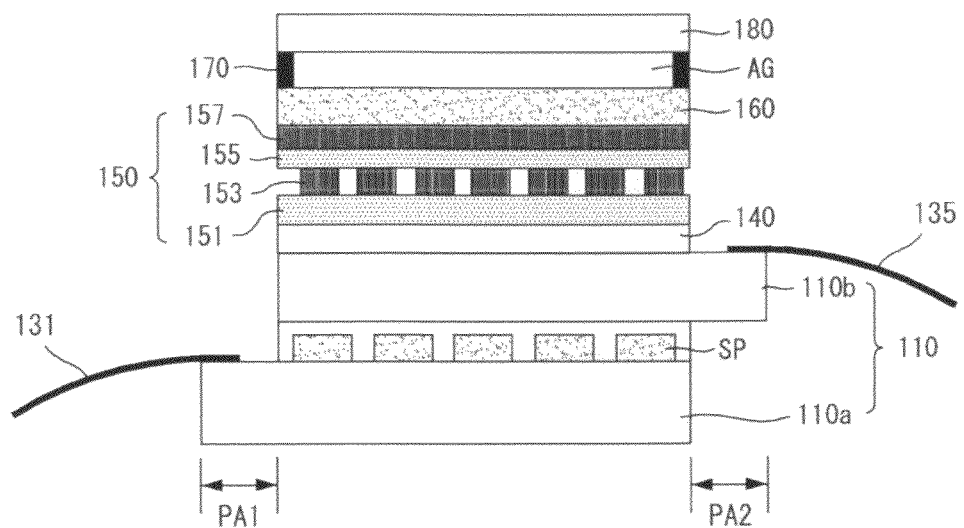
Figure 12:
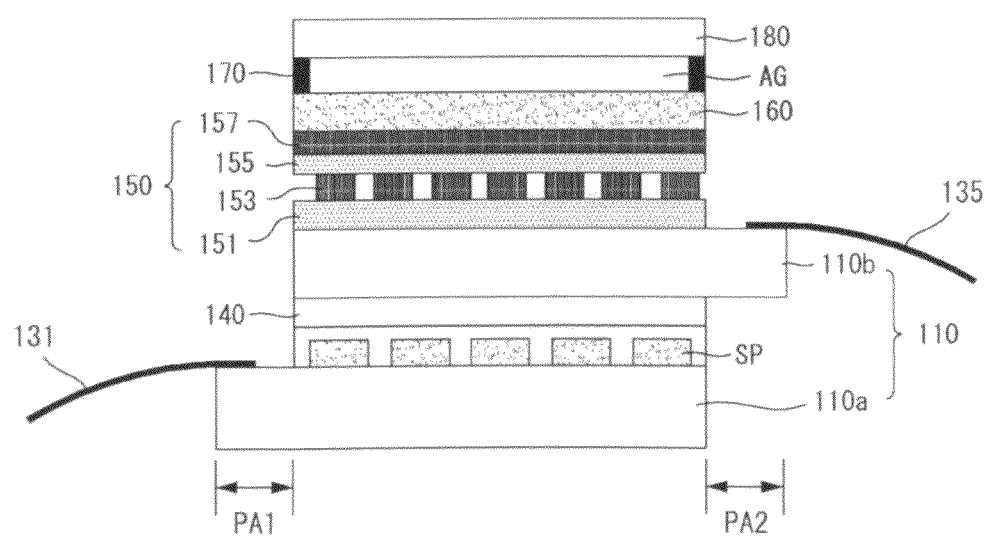

FIGS. 10 to 12 schematically illustrate a structure of an OLED display having a capacitive touch screen panel.

As shown in FIGS. 10 to 12, an OLED display having a touch screen panel includes a panel 110, a shield electrode 140, a touch screen panel 150, a polarizing plate 160, an adhesive 170, a cover window 180, a first printed circuit board (PCB) 131, and a second PCB 135.

FIG. 10 illustrates the OLED display in which subpixels SP on the panel 110 emit light in a front direction and an electrode unit on the touch screen panel 150 has a single-layered structure. In FIG. 10, the panel 110 includes subpixels SP on one surface of a first substrate 110a and a second substrate 110b attached to the first substrate 110a. The shield electrode 140 is formed on one surface of the second substrate 110b, that does not face the subpixels SP, and is connected to a low potential voltage source. The low potential voltage source may be selected as a ground level voltage source supplying a ground level voltage to the panel 110. The touch screen panel 150 is formed on the shield electrode 140. The touch screen panel 150 includes an insulating layer 151 and an electrode unit 153. The insulating layer 151 provides insulation between the shield electrode 140 and the electrode unit 153. The electrode unit 153, as shown in FIGS. 5 and 6, has a single-layered structure. The shield electrode 140 and the touch screen panel 150 are formed on the one surface of the second substrate 110b using a deposition method. The polarizing plate 160 is attached to the touch screen panel 150. The cover window 180 is attached to the polarizing plate 160 using the adhesive 170. The adhesive 170 may be formed in the form of a closed line surrounding an air layer AG, so that the air layer AG is formed between the polarizing plate 160 and the cover window 180, but is not limited thereto. The first PCB 131 is attached to a pad on the one surface of the first substrate 110a and receives a driving signal driving the subpixels SP from a driving device (for example, a timing controller). The second PCB 135 is attached to a pad on the one surface of the second substrate 110b and transmits a sensing signal generated by the touch screen panel 150 to a driving device (for example, a sensing unit).

FIG. 11 illustrates the OLED display in which subpixels SP on the panel 110 emit light in a front direction and an electrode unit on the touch screen panel 150 has a multi-layered structure. In FIG. 11, the touch screen panel 150 includes a plurality of insulating layers 151 and 155 and a plurality of electrode units 153 and 157. The insulating layer 151 provides insulation between the shield electrode 140 and first electrodes of the electrode unit 153, and the insulating layer 155 provides insulation between the first electrodes of the electrode unit 153 and second electrodes of the electrode unit 157. The electrode units 153 and 157, as shown in FIGS. 8 and 9, have a multi-layered structure. Since configuration of the panel 110, the shield electrode 140, the polarizing plate 160, and the cover window 180 may be substantially the same as those illustrated in FIG. 10, a further description may be briefly made or may be entirely omitted.

FIG. 12 illustrates the OLED display in which subpixels SP on the panel 110 emit light in a front direction and an electrode unit on the touch screen panel 150 has a multi-layered structure. In FIG. 12, the shield electrode 140 is formed inside the panel 110, i.e., on one surface of a second substrate 110*b* opposite the subpixels SP, and is connected to a low potential voltage source. Since configuration of the panel 110, the shield electrode 140, the touch screen panel 150, the polarizing plate 160, and the cover window 180 may be substantially the same as those illustrated in FIG. 11, a further description may be briefly made or may be entirely omitted. Although it is not shown, first electrodes 153, a second insulating layer 155, and second electrodes 157 may be formed on the other surface of the second substrate 110*b* in the order named in a state where a first insulating layer 151 included in the touch screen panel 150 is omitted.

As shown in FIGS. 10 to 12, the first substrate 110*a* includes a first pad area PA1 extending in an attaching direction of the first PCB 131 at one side of the first substrate 110*a*, and the second substrate 110*b* includes a second pad area PA2 extending in an attaching direction of the second PCB 135 at one side of the second substrate 110*b*. The OLED display illustrated in FIGS. 10 to 12 has a module structure in which the first PCB 131 can be led from the first pad area PA1 of the first substrate 110*a* and the second PCB 135 can be led from the second pad area PA2 of the second substrate 110*b*.

Figure 13:
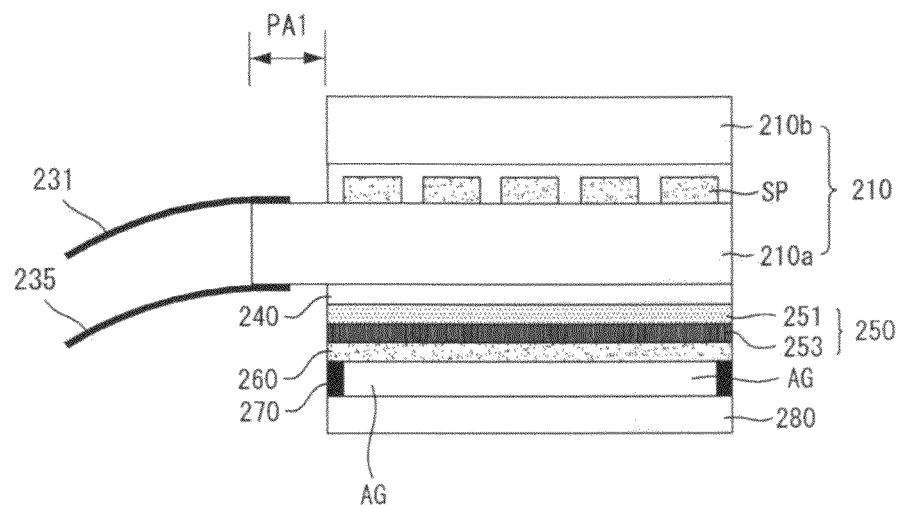
FIGS. 13 and 14 schematically illustrate another structure of an OLED display having a capacitive touch screen panel.
Figure 14:
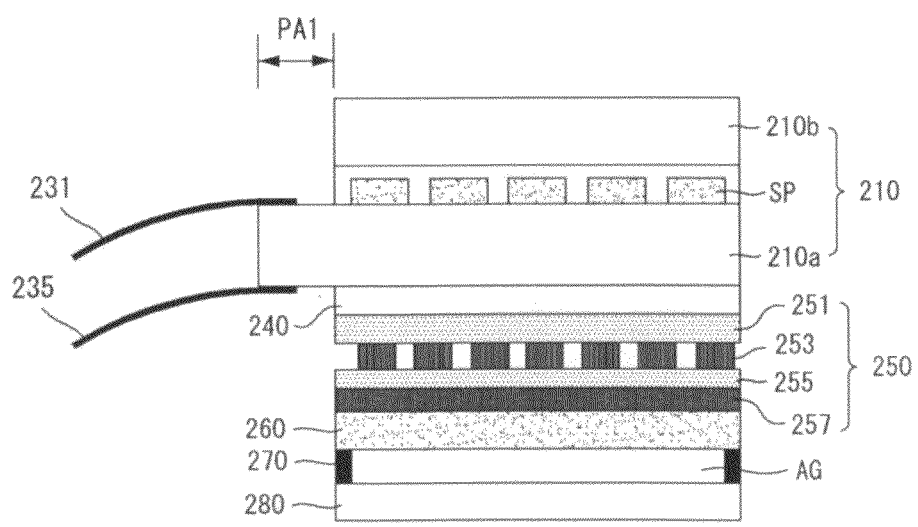

FIGS. 13 and 14 schematically illustrate another structure of an OLED display having a capacitive touch screen panel.

As shown in FIGS. 13 and 14, an OLED display having a touch screen panel includes a panel 210, a shield electrode 240, a touch screen panel 250, a polarizing plate 260, an adhesive 270, a cover window 280, a first PCB 231, and a second PCB 235.

FIG. 13 illustrates the OLED display in which subpixels SP on the panel 210 emit light in a rear direction and an electrode unit on the touch screen panel 250 has a single-layered structure. In FIG. 13, the shield electrode 240 is formed on one surface of a first substrate 210*a* and is connected to a low potential voltage source. The low potential voltage source may be selected as a ground level voltage source supplying a ground level voltage to the panel 210. The touch screen panel 250 is formed on the shield electrode 240. The touch screen panel 250 includes an insulating layer 251 and an electrode unit 253. The insulating layer 251 provides insulation between the shield electrode 240 and the electrode unit 253. The electrode unit 253, as shown in FIGS. 5 and 6, has a single-layered structure. The shield electrode 240 and the touch screen panel 250 are formed on the one surface of the first substrate 210*a* using a deposition method. The polarizing plate 260 is attached to the touch screen panel 250. The cover window 280 is attached to the polarizing plate 260 using the adhesive 270. The adhesive 270 may be formed in the form of a closed line surrounding an air layer AG, so that the air layer AG is formed between the polarizing plate 260 and the cover window 280, but is not limited thereto. The first PCB 231 is attached to a pad on the other surface of the first substrate 210*a* and receives a driving signal driving the subpixels SP from a driving device (for example, a timing controller). The second PCB 235 is attached to a pad on the one surface of the first substrate 210*a* and transmits a sensing signal generated by the touch screen panel 250 to a driving device (for example, a sensing unit).

FIG. 14 illustrates the OLED display in which subpixels SP on the panel 210 emit light in a rear direction and an electrode unit on the touch screen panel 250 has a multi-layered structure. In FIG. 14, the touch screen panel 250 includes a plurality of insulating layers 251 and 255 and a plurality of electrode units 253 and 257. The insulating layer 251 provides insulation between the shield electrode 240 and first electrodes of the electrode unit 253, and the insulating layer 255 provides insulation between the first electrodes of the electrode unit 253 and second electrodes of the electrode unit 257. The electrode units 253 and 257, as shown in FIGS. 8 and 9, have a multi-layered structure. Since configuration of the panel 210, the shield electrode 240, the polarizing plate 260, and the cover window 280 may be substantially the same as those illustrated in FIG. 13, a further description may be briefly made or may be entirely omitted.

As shown in FIGS. 13 and 14, the first substrate 210*a* includes a first pad area PA1 extending in an attaching direction of the first PCB 231 and the second PCB 235 at one side of the first substrate 210*a*. Because the first substrate 210*a* includes the first pad area PA1, a length of the first substrate 210*a* is longer than a length of the second substrate 210 by a length of the first pad area PA1. The OLED display illustrated in FIGS. 13 and 14 has a module structure in which the first PCB 231 and the second PCB 235 respectively formed on both surfaces of the first substrate 210*a* can be led from the first pad area PA1.

Figure 15:
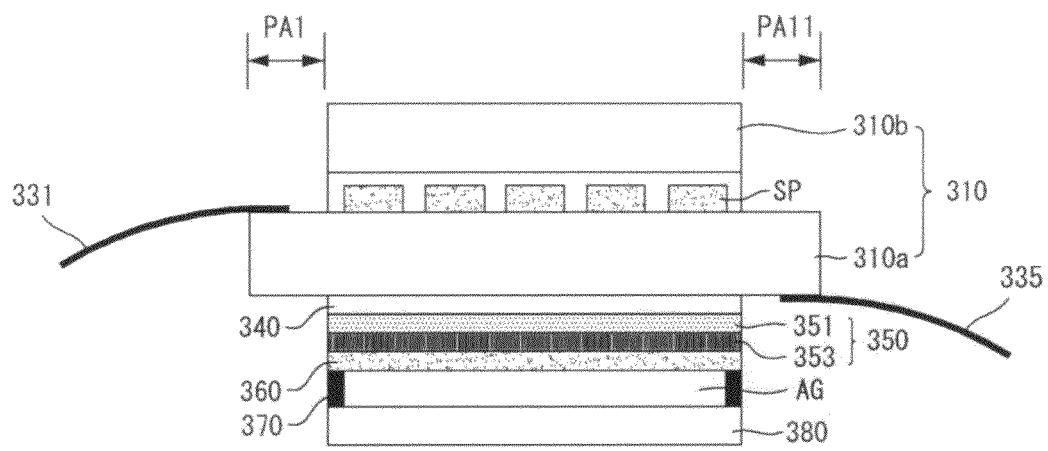
FIGS. 15 and 16 schematically illustrate another structure of an OLED display having a capacitive touch screen panel.
Figure 16:
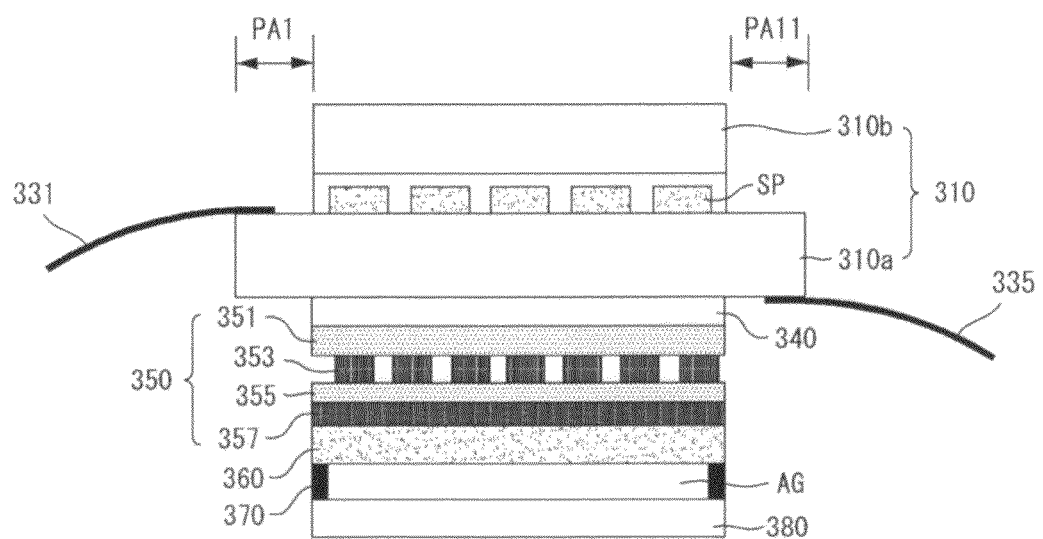

FIGS. 15 and 16 schematically illustrate another structure of an OLED display having a capacitive touch screen panel.

As shown in FIGS. 15 and 16, an OLED display having a touch screen panel includes a panel 310, a shield electrode 340, a touch screen panel 350, a polarizing plate 360, an adhesive 370, a cover window 380, a first PCB 331, and a second PCB 335.

FIG. 15 illustrates the OLED display in which subpixels SP on the panel 310 emit light in a rear direction and an electrode unit on the touch screen panel 350 has a single-layered structure. In FIG. 15, the shield electrode 340 is formed on one surface of a first substrate 310*a* and is connected to a low potential voltage source. The low potential voltage source may be selected as a ground level voltage source supplying a ground level voltage to the panel 310. The touch screen panel 350 is formed on the shield electrode 340. The touch screen panel 350 includes an insulating layer 351 and an electrode unit 353. The insulating layer 351 provides insulation between the shield electrode 340 and the electrode unit 353. The electrode unit 353, as shown in FIGS. 5 and 6, has a single-layered structure. The shield electrode 340 and the touch screen panel 350 are formed on the one surface of the first substrate 310*a* using a deposition method. The polarizing plate 360 is attached to the touch screen panel 350. The cover window 380 is attached to the polarizing plate 360 using the adhesive 370. The adhesive 370 may be formed in the form of a closed line surrounding an air layer AG, so that the air layer AG is formed between the polarizing plate 360 and the cover window 380, but is not limited thereto. The first PCB 331 is attached to a pad on the other surface of the first substrate 310a and receives a driving signal driving the subpixels SP from a driving device (for example, a timing controller). The second PCB 335 is attached to a pad on the one surface of the first substrate 310a and transmits a sensing signal generated by the touch screen panel 350 to a driving device (for example, a sensing unit).

FIG. 16 illustrates the OLED display in which subpixels SP on the panel 310 emit light in a rear direction and an electrode unit on the touch screen panel 350 has a multi-layered structure. In FIG. 16, the touch screen panel 350 includes a plurality of insulating layers 351 and 355 and a plurality of electrode units 353 and 357. The insulating layer 351 provides insulation between the shield electrode 340 and first electrodes of the electrode unit 353, and the insulating layer 355 provides insulation between the first electrodes of the electrode unit 353 and second electrodes of the electrode unit 357. The electrode units 353 and 357, as shown in FIGS. 8 and 9, have a multi-layered structure. Since configuration of the panel 310, the shield electrode 340, the polarizing plate 360, and the cover window 380 may be substantially the same as those illustrated in FIG. 15, a further description may be briefly made or may be entirely omitted.

As shown in FIGS. 15 and 16, the first substrate 310a includes a first pad area PA 1 extending in an attaching direction of the first PCB 331 at one side of the first substrate 310a and a second pad area PA11 extending in an attaching direction of the second PCB 335 at the other side of the first substrate 310a. Because the first substrate 210a includes the first pad area PA1 and the second pad area PA11, a length of the first substrate 310a is longer than a length of the second substrate 310b by a sum of lengths of the first and second pad areas PA 1 and PA 11. The OLED display illustrated in FIGS. 15 and 16 has a module structure in which the first PCB 331 and the second PCB 335 can be respectively led from the first pad area PA1 and the second pad area PA11 at both sides of the first substrate 310a.

As described above, in the OLED display having the touch screen panel according to the embodiment of the invention, because the shield electrode connected to the low potential voltage source is formed on the panel and the touch screen panel is formed on the shield electrode, the OLED display having the touch screen panel with a strong resistance against external and internal noises can be provided. Further, the OLED display having the touch screen panel can be used in various applications.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode (OLED) display comprising:
   a plurality of subpixels on one surface of a first substrate;
   a second substrate attached to the first substrate;
   a shield electrode directly on one surface of the second substrate that does not face the subpixels, the shield electrode being connected to a low potential voltage source;
   a touch screen panel directly on the shield electrode;
   a first printed circuit board (PCB) attached to the one surface of the first substrate, the first PCB receiving a driving signal driving the subpixels from a driving device;
   a second PCB attached to the one surface of the second substrate, the second PCB transmitting a sensing signal generated by the touch screen panel to an external device;
   a polarizing plate on the touch screen panel; and
   a cover window on the polarizing plate,
   wherein the polarizing plate and the cover window are attached to each other using an adhesive surrounding an air layer, so that the air layer is formed between the polarizing plate and the cover window and the cover window is the most outside layer.

2. The OLED display of claim 1, wherein the first substrate includes a first pad area extending in an attaching direction of the first PCB at one side of the first substrate, and the second substrate includes a second pad area extending in an attaching direction of the second PCB at one side of the second substrate.

3. The OLED display of claim 1, wherein the touch screen panel has a single-layered structure including one transparent electrode or a multi-layered structure including two transparent electrodes.

4. An organic light emitting diode (OLED) display comprising:
   a plurality of subpixels on one surface of a first substrate;
   a second substrate attached to the first substrate;
   a shield electrode directly on other surface of the first substrate on which the subpixels are not formed, the shield electrode being connected to a low potential voltage source;
   a touch screen panel directly on the shield electrode;
   a first printed circuit board (PCB) attached to the one surface of the first substrate, the first PCB receiving a driving signal driving the subpixels from a driving device; and
   a second PCB attached to the other surface of the first substrate, the second PCB transmitting a sensing signal generated by the touch screen panel to an external device;
   a polarizing plate on the touch screen panel; and
   a cover window on the polarizing plate,
   wherein the polarizing plate and the cover window are attached to each other using an adhesive surrounding an air layer, so that the air layer is formed between the polarizing plate and the cover window and the cover window is the most outside layer.

5. The OLED display of claim 4, wherein the first substrate includes a first pad area extending in an attaching direction of the first and second PCBs.

6. The OLED display of claim 5, wherein a length of the first substrate is longer than a length of the second substrate by a length of the first pad area.

7. The OLED display of claim 4, wherein the touch screen panel has a single-layered structure including one transparent electrode or a multi-layered structure including two transparent electrodes.

8. An organic light emitting diode (OLED) display comprising:
   a plurality of subpixels on one surface of a first substrate;
   a second substrate attached to the first substrate;
   a shield electrode directly on other surface of the first substrate that does not face the subpixels, the shield electrode being connected to a low potential voltage source;
   a touch screen panel directly on the shield electrode;
   a first printed circuit board (PCB) attached to the one surface of the first substrate, the first PCB receiving a driving signal driving the subpixels from a driving device;
   a second PCB attached to the other surface of the first substrate, the second PCB transmitting a sensing signal generated by the touch screen panel to an external device;
   a polarizing plate on the touch screen panel; and
   a cover window on the polarizing plate,
   wherein the polarizing plate and the cover window are attached to each other using an adhesive surrounding an air layer, so that the air layer is formed between the polarizing plate and the cover window and the cover window is the most outside layer.

9. The OLED display of claim 8, wherein the first substrate includes a first pad area extending in an attaching direction of the first PCB at one side of the first substrate and a second pad area extending in an attaching direction of the second PCB at other side of the first substrate.

10. The OLED display of claim 9, wherein a length of the first substrate is longer than a length of the second substrate by a sum of lengths of the first and second pad areas.

11. The OLED display of claim 8, wherein the touch screen panel has a single-layered structure including one transparent electrode or a multi-layered structure including two transparent electrodes.

* * * * *